United States Patent [19]

Kudo

[11] Patent Number: 5,798,824
[45] Date of Patent: Aug. 25, 1998

[54] EXPOSURE APPARATUS CORRECTING ILLUMINANCE DISTRIBUTION

[75] Inventor: Yuji Kudo, Kawasaki, Japan

[73] Assignee: Nikon Corporation, Japan

[21] Appl. No.: 576,667

[22] Filed: Dec. 21, 1995

[30] Foreign Application Priority Data

Dec. 26, 1994 [JP] Japan .................. 6-337344

[51] Int. Cl.[6] .............. G03B 27/42; G03B 27/54
[52] U.S. Cl. ............ 355/67; 355/53; 359/209; 359/211
[58] Field of Search ............ 359/211, 209; 355/53, 55, 67, 77

[56] References Cited

U.S. PATENT DOCUMENTS

| | | | |
|---|---|---|---|
| Re. 34,634 | 6/1994 | Konno et al. ............. | 362/268 |
| 4,497,015 | 1/1985 | Konno et al. ............. | 362/268 |
| 4,851,978 | 7/1989 | Ichihara . | |
| 4,918,583 | 4/1990 | Kudo et al. . | |
| 5,067,811 | 11/1991 | Ouchi ............. | 356/121 |
| 5,237,367 | 8/1993 | Kudo . | |
| 5,245,384 | 9/1993 | Mori . | |
| 5,392,094 | 2/1995 | Kudo . | |
| 5,459,547 | 10/1995 | Shiozawa ............. | 355/67 |
| 5,621,499 | 4/1997 | Shiozawa ............. | 355/67 |

FOREIGN PATENT DOCUMENTS

| | | |
|---|---|---|
| 62-123423 | 6/1987 | Japan . |
| 3-16114 | 1/1991 | Japan . |
| 3-254114 | 11/1991 | Japan . |

*Primary Examiner*—R. L. Moses
*Assistant Examiner*—Shival Virmani
*Attorney, Agent, or Firm*—Pennie & Edmonds LLP

[57] ABSTRACT

The present invention relates to an illumination optical apparatus capable of correcting unevenness of an illuminance distribution on an illuminated surface, particularly slant unevenness thereof. The illumination optical apparatus comprises a light source unit for supplying a nearly parallel beam, a multi-light-source forming system for forming a plurality of light source images, based on the light beam from the light source unit, a condenser optical system for condensing the light from the multi-light-source forming system to illuminate a surface of an object in a superimposed manner, and a deflecting device for changing an angle of incidence of the light into the multi-light-source forming system, disposed in an optical path between the light source unit and the multi-light-source forming system.

40 Claims, 9 Drawing Sheets

LE

LE

EXPOSURE APPARATUS CORRECTING ILLUMINANCE DISTRIBUTION

BACKGROUND OF THE INVENTION

1. Field of the Invention

The present invention relates to an illumination optical apparatus, and more particularly to an illumination optical apparatus, used in exposure apparatus for fabricating semiconductor devices, liquid crystal display devices, etc., for illuminating an object such as a mask or a reticle with patterns for transfer formed therein at even illuminance.

2. Related Background Art

The illumination optical apparatus of this type, used in exposure apparatus for fabricating highly integrated semiconductor devices etc., is required to have excellent evenness of illuminance on a surface of an illuminated object. Therefore, the conventional illumination optical apparatus of this type employed a device for realizing superimposed illumination on the illuminated surface through an optical integrator such as a fly's eye lens.

FIG. 1 is a drawing to diagrammatically show the construction of a conventional illumination optical apparatus.

In FIG. 1 a light beam supplied from a light source means 1 is shaped by a beam shaping optical system 2 and thereafter the shaped beam enters a first fly's eye lens 3. The light beam incident into the first fly's eye lens 3 is two-dimensionally split by a plurality of lens elements constituting the first fly's eye lens 3, thereby forming a plurality of secondary light source images at a rear focus position 4 of the first fly's eye lens 3.

Light beams from the plurality of secondary light source images are condensed by a condenser optical system 5a, 5b and thereafter illuminate a second fly's eye lens 6 in a superimposed manner. The light beams incident into the second fly's eye lens 6 are two-dimensionally split by a plurality of lens elements constituting the second fly's eye lens 6 to form a plurality of tertiary light source images at a rear focus position 7 of the second fly's eye lens 6.

Light beams from the plurality of tertiary light source images are limited by an aperture stop 8 and thereafter are condensed by a condenser lens 9 to illuminate an illuminated surface 10, for example a mask, in a superimposed manner.

In the illumination optical apparatus as described above, the first fly's eye lens 3 and condenser optical system 5a, 5b split and superimpose the light and thereafter the second fly's eye lens 6 and condenser lens 9 again split and superimpose the light. As a result, a nearly even illuminance distribution is obtained on the illuminated surface 10 even if the light beam supplied from the light source means 1 shows poor evenness.

In some applications of the above illumination optical apparatus to projection exposure apparatus, a bending mirror M is sometimes placed in the optical path, as shown in FIG. 2.

SUMMARY OF THE INVENTION

An illumination optical apparatus of the present invention comprises light source means for supplying a nearly parallel light beam, multi-light-source forming means for forming a plurality of light source images, based on the light beam from the light source means, and a condenser optical system for condensing light beams from the multi-light-source forming means to illuminate an object plane in a superimposed manner, wherein deflecting means for changing an angle of incidence of the light beam incident to the multi-light-source forming means is placed in an optical path between the light source means and the multi-light-source forming means.

In a preferred embodiment, the multi-light-source forming means comprises a first optical integrator for forming a plurality of light source images, based on the light beam from the light source means, a second optical integrator placed in light beams emitted from the first optical integrator, and a condenser optical system, placed in an optical path between the first optical integrator and the second optical integrator, for condensing light from the plurality of light source images formed by the first optical integrator, wherein the deflecting means is arranged to change angles of incidence of the light beams incident to the second optical integrator.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
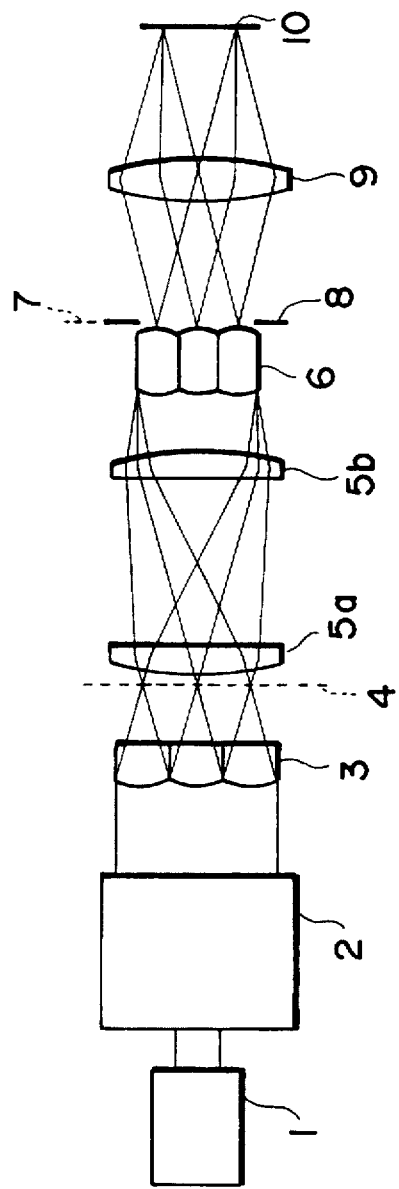
FIG. 1 is a drawing to schematically show the construction of a conventional illumination optical apparatus.
Figure 2:
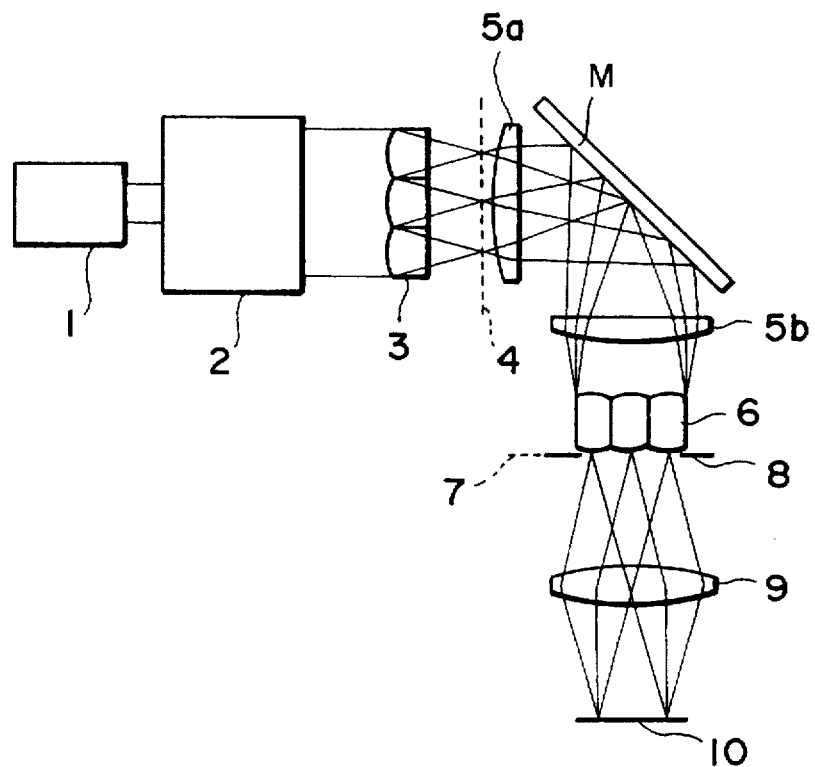
FIG. 2 is a drawing to schematically show a conventional illumination optical apparatus provided with a mirror for bending an optical path.

When the bending mirror M as shown in FIG. 2 is placed in the optical path, evenness of illuminance distribution on the illuminated surface 10 could be degraded because of angular characteristics of a reflecting film of mirror M, for example. Even if no bending mirror M is placed in the optical path, there are some cases where the evenness of illuminance distribution on the illuminated surface 10 is degraded because of fine eccentricity of constituent components, coating nonuniformity, or dirt.

However, when the conventional illumination optical apparatus as shown in FIG. 2 had, for example, slant unevenness of illuminance distribution due to the angular characteristics of the reflecting film of mirror M placed in the optical path, the apparatus was unable to be corrected for the slant unevenness.

In the present invention, the light beam incident into the optical integrator is deflected to change the angle of incidence, whereby the illuminance distribution is properly changed on the illuminated surface, thereby correcting, for example, the slant unevenness of illuminance distribution.

Next explained is a principle of changing the illuminance distribution on the illuminated surface by changing an angle (incident angle) of the light beam incident into the fly's eye lens.

Figure 3:
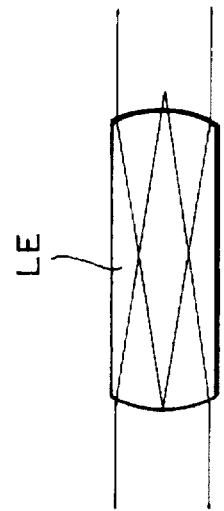
FIGS. 3 and 4 are drawings to show the construction of lens elements constituting a fly's eye lens.
Figure 4:
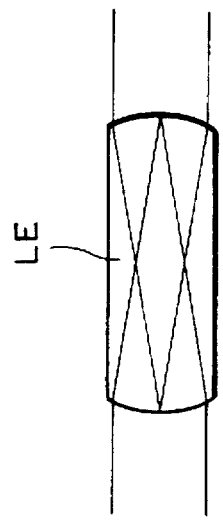

Generally, the fly's eye lens is composed of a plurality of lens elements arranged in a matrix of columns and rows. As shown in FIG. 3, each lens element LE is so arranged that a front focus position becomes coincident with the lens entrance surface and a rear focus position with the lens exit surface. For the cases with a laser as a light source, there are lens elements having an arrangement to make a refractive power of the entrance surface different from that of the exit surface so as to locate the rear focus position outside the lens exit surface, as shown in FIG. 4 (for example as described in the bulletin of Japanese Laid-open Patent Application No. 64-081222). Applicable to the lens elements having either of the arrangements is the principle of the present invention to change the illuminance distribution by changing the angle of incident light beam.

Figure 5:
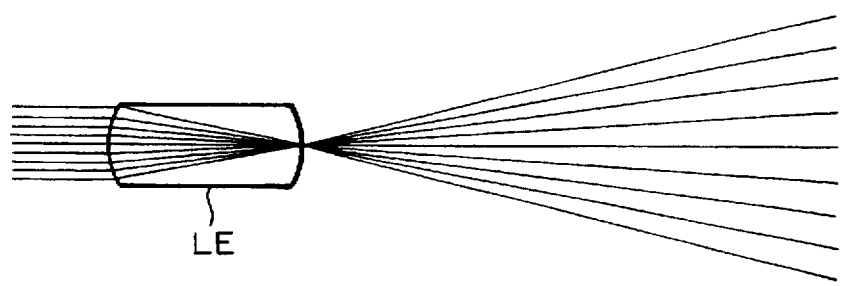
FIGS. 5 and 6 are drawings to show states of rays diverging from an exit surface after the rays are incident into a lens element in the fly's eye lens.
Figure 6:
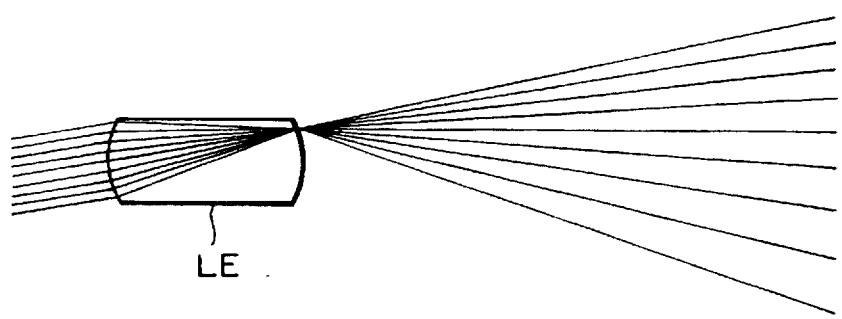

FIGS. 5 and 6 are drawings to show states of rays diverging from the exit surface after the rays are incident into a lens element LE in the fly's eye lens. FIG. 5 shows a case in which the rays are incident in parallel with the optical axis, and FIG. 6 a case in which the rays are incident obliquely relative to the optical axis.

As shown in FIG. 5, an angular distribution of rays diverging from the exit surface is symmetric with respect to the optical axis where the rays were incident into the lens element LE of fly's eye lens in parallel with the optical axis.

On the other hand, where the rays were incident into the lens element LE obliquely to the optical axis, as shown in FIG. 6, the angular distribution of rays diverging from the exit surface becomes asymmetric with respect to the optical axis because of an effect of comatic characteristics etc. specific to the lens element LE.

Figure 7:
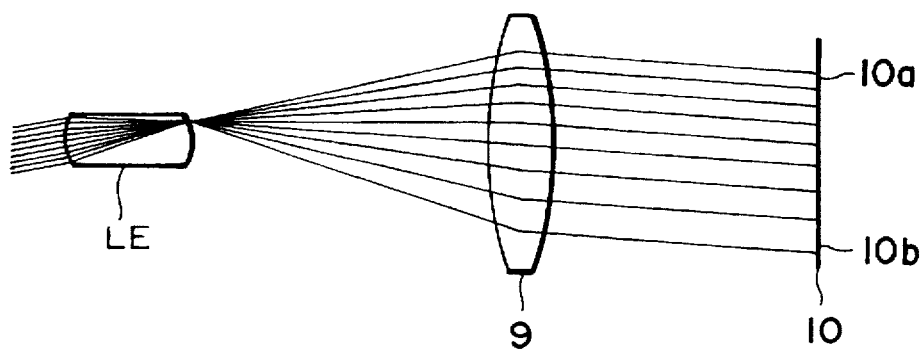
FIG. 7 is a drawing to show a case in which rays are incident into a lens element obliquely relative to the optical axis and a condenser lens changes the rays diverging from the exit surface into a beam of parallel rays, thereby illuminating the illuminated surface under Köhler illumination.

FIG. 7 shows a state of Köhler illumination of the illuminated surface 10 with a parallel beam into which the condenser lens 9 converts the rays diverging from the exit surface where the rays were incident into the lens element LE obliquely relative to the optical axis.

Figure 8:
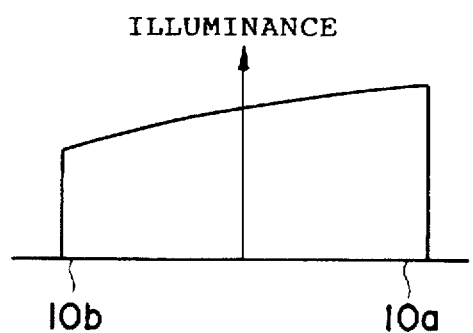
FIG. 8 is a drawing to show a slant illuminance distribution on the illuminated surface.

As shown in FIG. 7, a density of rays is high on the upper side in the drawing or the side of 10a on the illuminated surface 10, whereas it gradually decreases toward the lower side in the drawing or the side of 10b on the illuminated surface 10. Thus obtained is a so-called slant illuminance distribution in which the illuminance monotonously decreases from the side of 10a to the side of 10b, as shown in FIG. 8.

As described, the illuminance distribution can be changed on the illuminated surface by changing the angle of the beam incident into the fly's eye lens.

In the cases where the bending mirror is placed in the optical path, the evenness of illuminance distribution on the illuminated surface is sometimes degraded because of the angular characteristics of the reflecting film of mirror, as described previously. Even in the cases where no bending mirror is placed in the optical path, the evenness of illuminance distribution on the illuminated surface could be degraded because of fine eccentricity of constituent components, coating nonuniformity, or dirt. As a result, the illuminance distribution on the illuminated surface could indicate slant unevenness as shown by the solid line 50a in FIG. 9.

Figure 9:
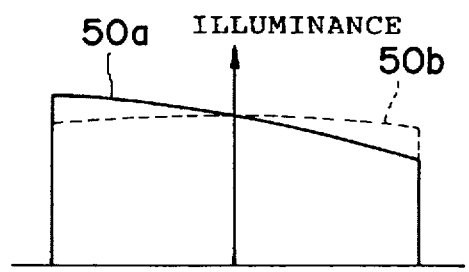
FIG. 9 is a drawing to illustrate correction of slant illuminance distribution on the illuminated surface.

In this case, an almost even illuminance distribution as shown by the dashed line 50b in FIG. 9 can be obtained by properly changing the angle of the beam incident into the fly's eye lens so as to correct the illuminance distribution 50a having the slant unevenness, utilizing the principle of the present invention as discussed above.

When a plurality of fly's eye lenses are placed in series in the optical path, it is effective to change the angle of the beam incident into the fly's eye lens placed closest to the illuminated surface.

A method for changing the angle of the beam incident into the fly's eye lens may be one of a method for decentering an appropriate optical member out of those placed on the light source side of the fly's eye lens relative to the optical axis, a method for deflecting a light beam by a desired angle by a combinational angle-deviating function of plural angle-deviating prisms, etc.

FIRST EMBODIMENT

Figure 10:
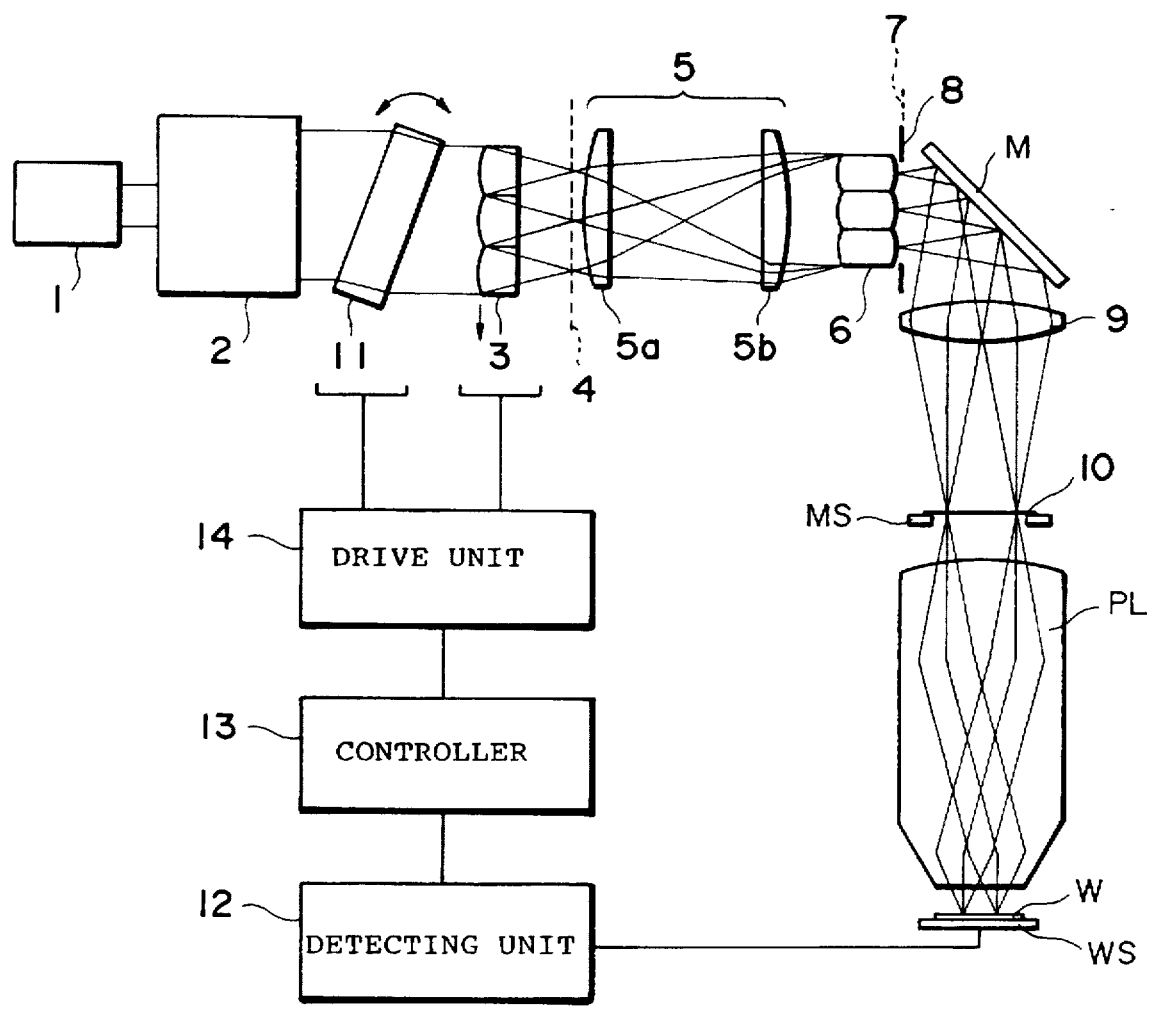
FIG. 10 is a drawing to schematically show the construction of an illumination optical apparatus of the first embodiment.

FIG. 10 is a drawing to schematically show the construction of an illumination optical apparatus of the first embodiment of the present invention. The first embodiment shows an example in which the illumination optical apparatus of the present invention is applied to a projection exposure apparatus.

The illumination optical apparatus of FIG. 10 is provided with the light source means 1, for example such as an excimer laser. A light beam supplied from the light source means 1 is shaped by the beam shaping optical system 2 into a shape suitable for the first fly's eye lens 3 as explained below, and thereafter advances through a halving 11 into the first fly's eye lens 3.

The halving 11 is composed of a plane-parallel plate arranged as rotatable about two directions, for example a predetermined direction perpendicular to the optical axis, and a direction perpendicular to the same predetermined direction and the-optical axis. The halving 11 may be a plane-parallel plate arranged as rotatable about a predetermined direction perpendicular to the optical axis and also rotatable about the optical axis.

The light beam incident into the first fly's eye lens 3 is two-dimensionally split by a plurality of lens elements constituting the first fly's eye lens 3 to form a plurality of secondary light source images at the rear focus position 4 of the first fly's eye lens 3.

Light beams from the plurality of secondary light source images are condensed by the condenser optical system 5 composed of a pair of lenses 5a and 5b, and thereafter illuminate the second fly's eye lens 6 in a superimposed manner. The light beams incident into the second fly's eye lens 6 are two-dimensionally split by a plurality of lens elements constituting the second fly's eye lens 6 to form a plurality of tertiary light source images at the rear focus position 7 of the second fly's eye lens 6. Thus, the first fly's eye lens 3, condenser optical system 5, and second fly's eye lens 6 compose a multi-light-source forming means for forming a plurality of light source images, based on the light beam from the light source means 1.

Light beams from the plurality of tertiary light source images are limited by the aperture stop 8, are reflected by the bending mirror M, and thereafter are condensed by the condenser lens 9 to illuminate the mask 10 in a superimposed manner. The mask 10 is supported by a mask stage MS. Light beams transmitted by the mask 10 advance through a projection optical system PL to reach the image plane W of projection optical system PL. A silicon substrate or the like coated with a photosensitive resist is normally located at the position of the image plane W, and the projection optical system PL makes the position of the mask 10 conjugate with the position of the image plane W.

The illumination optical apparatus of FIG. 10 is provided with a detecting unit 12 for detecting an illuminance distribution on the image plane W. The detecting unit 12 is composed of a photodetector provided on a two-dimensionally movable wafer stage WS for holding an object to be exposed, for example such as a wafer. The illuminance distribution detected by the detecting unit 12 is sent to a controller 13.

The illumination optical apparatus of FIG. 10 is further provided with a drive unit 14 for moving the first fly's eye lens 3 in a direction perpendicular to the optical axis. This drive unit 14 is controlled by the controller 13 to rotate the halving 11 as shown. The halving 11 displaces the light beam by a moving distance of the first fly's eye lens 3 in parallel with the optical axis so that the light beam incident into the first fly's eye lens 3 tracks movement of the first fly's eye lens 3. Thus, the halving 11 composes a beam displacing means for displacing the light beam incident into the first fly's eye lens in a direction perpendicular to the optical axis.

Next explained is the operation to correct the illuminance distribution of the illumination optical apparatus of the first embodiment constructed as described above.

First, the controller 13 makes the detecting unit 12 detect the illuminance distribution on the image plane W of projection optical system PL. In the present embodiment, a memory in the controller 13 stores the relationship between illuminance distributions on the image plane W and drive amounts of the first fly's eye lens necessary for correcting the slant unevenness. The memory in the controller 13 also stores information on rotation drive amounts of halving 11 corresponding to the drive amounts of first fly's eye lens.

Next, based on the slant unevenness of illuminance distribution detected, the controller 13 outputs a drive command including information on drive amount and rotation drive amount of first fly' eye lens 3 and halving 11 to the drive unit 14. The drive unit 14 drives the first fly's eye lens 3 and halving 11 in accordance with the drive command from the controller 13, thereby changing the angle of the light beam incident into the second fly's eye lens 6.

The above control changes the illuminance distribution on the image plane W, thereby correcting the slant unevenness of illuminance distribution.

Although the above example showed the control of the drive unit 14 based on the memory in the controller 13, the following control can also be employed. First, the detecting unit 12 detects the illuminance distribution on the image plane W, and thereafter the drive unit 14 moves the first fly's eye lens 3 and halving 11 in a predetermined direction. After that, the illuminance distribution on the image plane W is again detected by the detecting unit 12 and the drive unit 14 again moves the first fly's eye lens 3 and halving 11. This operation is repeated before the slant unevenness is corrected.

The above-discussed embodiment concerns the projection exposure apparatus for forming an image of the illuminated surface through the projection optical system PL, and is arranged to correct the illuminance distribution on the image plane W of projection optical system PL. However, in applications other than those to the projection exposure apparatus, the apparatus may be arranged in such a manner that the detecting unit 12 detects an illuminance distribution on the mask 10, which is the illuminated surface, and the illuminance distribution on the mask 10 is corrected according to the above correction operation.

Further, the above explanation concerned driving the both first fly's eye lens 3 and halving 11, but without providing the halving 11, only the first fly's eye lens 3 may be driven to achieve the same operational effect of the present invention. In this case, the beam shaping optical system 2 needs to shape the beam in such a sufficiently large size that the light beam can enter the region of the entrance surfaces of all lens elements in the first fly's eye lens 3 even with movement of the first fly's eye lens 3 in the direction perpendicular to the optical axis.

SECOND EMBODIMENT

Figure 11:
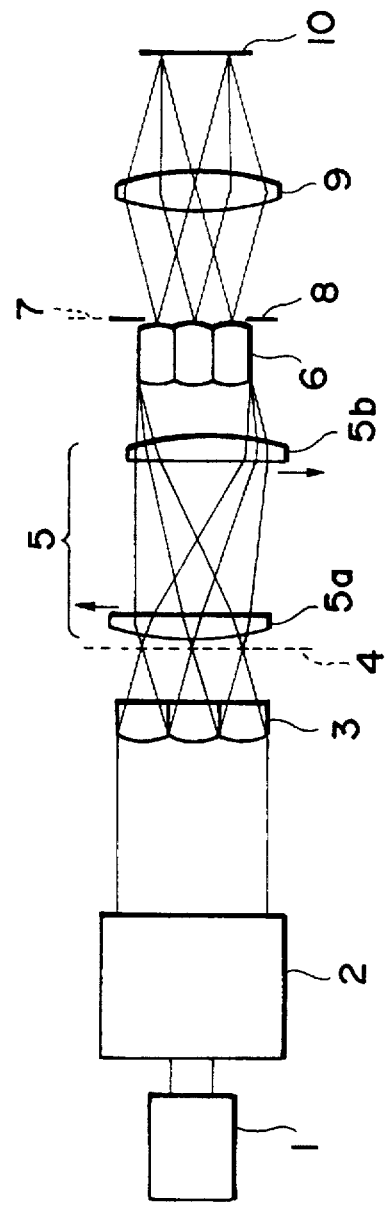
FIG. 11 is a drawing to schematically show the construction of another illumination optical apparatus of the second embodiment.

FIG. 11 is a drawing to schematically show the construction of an illumination optical apparatus of the second embodiment of the present invention. FIG. 11 is drawn as omitting illustration of the projection optical system PL, detecting unit 12, controller 13, and driving unit 14.

As shown in FIG. 11, the second embodiment is similar to the first embodiment, but is basically different only in that the first embodiment is arranged to deflect the light beam by the first fly's eye lens while the second embodiment is arranged to deflect the light beam by the condenser optical system. Accordingly, in FIG. 11 constituent elements having the same functions as those in FIG. 10 are denoted by the same reference numerals. The second embodiment will be explained focusing on the deflecting operation of light beam.

In the second embodiment, the lens 5b adjacent to the second fly's eye lens 6 out of the condenser optical system 5 consisting of the pair of lenses 5a and 5b is moved in a direction perpendicular to the optical axis, thereby deflecting the light beams incident into the second fly's eye lens 6. In this case, if only the lens 5b is moved in the direction perpendicular to the optical axis, incidence positions of the light beams into the second fly's eye lens 6 deviate in the direction of movement of lens 5b with change of angles of the light beams incident into the second fly's eye lens 6.

Thus, in order to correct the deviation of the incidence positions of the light beams into the second fly's eye lens 6, the other lens 5a should be moved in the direction opposite to the moving direction of the lens 5b. In this manner the angles of the light beams incident into the second fly's eye lens 6 can be changed without deviation of the incidence positions of the light beams relative to the second fly's eye lens 6.

Generally, the condenser optical system 5 is composed of a plurality of lens components arranged along the optical axis. If at least one lens component out of the plurality of lens components is moved in a direction substantially perpendicular to the optical axis, the angles of the light beams emerging from the condenser optical system 5 and entering the second optical integrator (the second fly's eye lens 6 in the embodiment) can be changed.

For example, in the case where the condenser optical system 5 is composed of a pair of lens groups both having a positive refractive power, a suitable arrangement is such that the whole or a part of one lens group arranged on the side of the second optical integrator is moved in the direction substantially perpendicular to the optical axis. In this case, the deviation (change) of the incidence positions of the light beams with respect to the second optical integrator can be corrected by moving the other lens group placed on the side of the first optical integrator in the direction opposite to the moving direction of the one lens group (the lens group placed on the side of the second optical integrator).

THIRD EMBODIMENT

Figure 12:
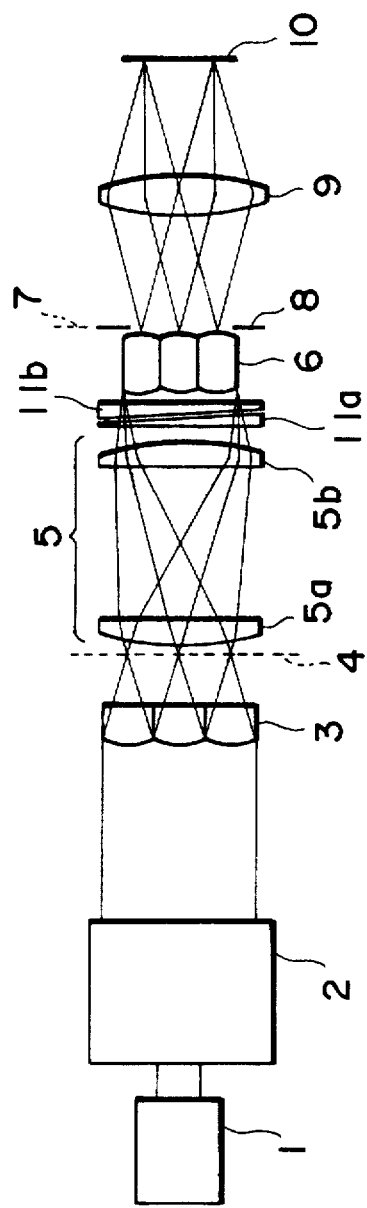
FIG. 12 is a drawing to schematically show the construction of another illumination optical apparatus of the third embodiment.

FIG. 12 is a drawing to schematically show the construction of an illumination optical apparatus of the third embodiment of the present invention. As shown in FIG. 12, the third embodiment is similar to the second embodiment, but is basically different only in that the second embodiment is arranged to deflect the light beam by the condenser optical system while the third embodiment is arranged to deflect the light beam by a pair of angle-deviating prisms. Accordingly, in FIG. 12 constituent elements having the same functions as those in FIG. 11 are denoted by the same reference numerals. The third embodiment will be explained focusing on the deflecting operation of light beam.

In the third embodiment, a pair of angle-deviating prisms 11a and 11b are provided between the condenser optical system 5 and the second fly's eye lens 6. Then the pair of angle-deviating prisms 11a and 11b are relatively rotated about the optical axis in directions opposite to each other, whereby the light beams incident into the second fly's eye lens 6 are deflected by a combinational angle-deviating function of the prisms.

In this case, the pair of angle-deviating prisms 11a and 11b are preferably arranged adjacent to the second fly's eye lens 6 in order to keep the incidence positions of the light beams with respect to the second fly's eye lens 6 so as not to deviate too much by the combinational angle-deviating function. In another case, the occurring deviation of the incidence positions of the light beams may be corrected by moving the lens 5a in a direction perpendicular to the optical axis, similarly as in the second embodiment.

In each of the embodiments as described above, changing the shape of the aperture stop 8 sometimes results in changing the illuminance distribution on the illuminated surface, as disclosed for example in the bulletin of Japanese Laid-open Patent Application No. 5-175101. Accordingly, if the shape of the aperture stop 8 is arranged to be changed by switching or the like of an iris stop or a revolver, a possible arrangement may be constructed in such a manner that the drive control of the optical member for deflection 3, 11, 5a, 5b, 11a, 11b as described above is motorized and an optimum offset amount is set therefor in synchronization with a change of the shape of the aperture stop 8.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 337344/1994 (6-337344) filed on Dec. 26, 1994, is hereby incorporated by reference.

What is claimed is:

1. An illumination optical apparatus for evenly illuminating an illuminated surface, comprising:

a light source;

a multi-light-source forming optical system for forming a plurality of light source images, based on a light beam from said light source;

a deflecting device disposed between said light source and said multi-light-source forming optical system, said deflecting device, in order to correct the illuminance distribution on said illuminated surface, changing density of light beam on said illuminated surface to adjust an angle of the light beam passing through said multi-light-source forming optical system, keeping a shape of plural-light-source images formed by said multi-light-source forming optical system to be substantially constant; and a condenser optical system for condensing a light beam from said multi-light-source forming optical system to illuminate a surface of an object in a superimposed manner.

2. The illumination optical apparatus according to claim 1, further comprising an auxiliary multi-light-source forming optical system different from said multi-light-source forming optical system and arranged between said light source and said multi-light-source forming optical system, and a collecting optical system between said auxiliary multi-light-source forming optical system and said multi-light-source forming optical system, said auxiliary multi-light-source forming optical system comprising an auxiliary optical integrator for forming a plurality of light source images based on the light beam from said light source, and said multi-light-source forming optical system, which is located at an exit side of said auxiliary multi-light-source forming optical system, comprising main optical integrator into which a light beam from said condenser optical system is incident.

3. The illumination optical apparatus according to claim 2, wherein said auxiliary optical integrator has a fly's eye lens.

4. The illumination optical apparatus according to claim 2, wherein said main optical integrator has a fly's eye lens.

5. The illumination optical apparatus according to claim 2, wherein said deflecting device moves said auxiliary optical integrator in a direction substantially perpendicular to an optical axis of said collecting optical system.

6. The illumination optical apparatus according to claim 2, further comprising a beam displacing device for displacing the light beam incident from said light source into said auxiliary optical integrator in a direction substantially perpendicular to an optical axis of said collecting optical system.

7. The illumination optical apparatus according to claim 6, wherein said beam displacing device has a halving arranged to rotate about an axis substantially perpendicular to the optical axis of said collecting optical system.

8. The illumination optical apparatus according to claim 2, wherein said deflecting device moves at least one lens component belonging to said condenser optical system in a direction substantially perpendicular to an optical axis of said collecting optical system.

9. The illumination optical apparatus according to claim 2, wherein said deflecting device comprises a pair of angle-deviating prisms arranged as rotatable about a direction of an optical axis of said collecting optical system and wherein said pair of angle-deviating prisms deflect the light beam incident into said main optical integrator when said angle-deviating prisms rotate opposite to each other.

10. The illumination optical apparatus according to claim 1, wherein said light source is a laser device.

11. The illumination optical apparatus according to claim 1, further comprising a mirror for bending an optical path, a reflecting characteristic of which changes depending upon an angle of incidence of light beam, said mirror being disposed between the surface of the object, illuminated in a superimposed manner by said condenser optical system, and said multi-light-source forming optical system.

12. The illumination optical apparatus according to claim 1, further comprising a detecting unit for detecting an illuminance distribution on the surface of the object illuminated in a superimposed manner by said condenser optical system, and a controller for controlling said deflecting device, based on an output from said detecting unit.

13. An exposure apparatus for transferring a pattern formed on a photomask onto a photosensitive substrate, comprising:

a light source;

a multi-light-source forming optical system for forming a plurality of light source images, based on a light beam from said light source;

a deflecting device disposed between said light source and said multi-light-source forming optical system, said deflecting device, in order to correct the illuminance distribution on said illuminated surface, changing density of light beam on said illuminated surface to adjust an angle of the light beam passing through said multi-light-source forming optical system, keeping a shape of plural light source images formed by said multi-light-source forming optical system to be substantially constant;

a first stage for supporting said photomask;

a condenser optical system for condensing a light beam from said multi-light-source forming optical system to illuminate said photomask in a superimposed manner;

a second stage for supporting said photosensitive substrate; and a projection optical system for keeping a position where said photomask is placed conjugate with a position where said photosensitive substrate is placed, said projection optical system guiding a light beam from said photomask to said photosensitive substrate.

14. The exposure apparatus according to claim 13, further comprising a detecting unit for detecting an illuminance distribution on said photosensitive substrate, and a controller for controlling said deflecting device, based on an output from said detecting unit.

15. An illumination optical apparatus for evenly illuminating an illuminated surface, comprising:

a light source;

a multi-light-source forming optical system for forming a plurality of light source images, based on a light beam from said light source;

a deflecting device disposed between said light source and said multi-light-source forming optical system, said deflecting device being movable in a direction in which said deflecting device is decentered with respect to said multi-light-source forming optical system and said deflecting device, in order to correct the illuminance distribution on said illuminated surface, changing density of light beam on said illuminated surface to adjust an angle of the light beam passing through said multi-light-source forming optical system, keeping a shape of plural-light-source images formed by said multi-light-source forming optical system to be substantially constant; and a condenser optical system for condensing a light beam from said multi-light-source forming optical system to illuminate a surface of an object in a superimposed manner.

16. An exposure apparatus for transferring a pattern formed on a photomask onto a photosensitive substrate, comprising:

a light source;

a first fly's eye lens;

a first optical system;

a second fly's eye lens;

a condenser optical system;

a first stage for supporting said photomask;

a projection optical system; and a second stage for supporting said photosensitive substrate, wherein a light beam from said light source reaches said photosensitive substrate by way of said first fly's eye lens, said first optical system, said second fly's eye lens, said condenser optical system, said photomask and said projection optical system in this order, and said first fly's eye lens is movable in a direction in which said first fly's eye lens is decentered with respect to said second fly's eye lens.

17. An exposure apparatus for transferring a pattern formed on a photomask onto a photosensitive substrate, comprising:

a light source;

a first fly's eye lens;

a first optical system;

a second fly's eye lens;

a condenser optical system;

a first stage for supporting said photomask;

a projection optical system; and a second stage for supporting said photosensitive substrate, wherein a light beam from said light source reaches said photosensitive substrate by way of said first fly's eye lens, said first optical system, said second fly's eye lens, said condenser optical system, said photomask and said projection optical system in this order, and said first optical system is disposed between said first fly's eye lens and said second fly's eye lens and said first optical system is movable in a direction in which said first optical system is decentered with respect to said second fly's eye lens.

18. An exposure apparatus for transferring a pattern formed on a photomask onto a photosensitive substrate, comprising:

a light source;

a first fly's eye lens;

a first optical system;

a second fly's eye lens;

a prism member;

a condenser optical system;

a first stage for supporting said photomask;

a projection optical system; and a second stage for supporting said photosensitive substrate, wherein a light beam from said light source reaches said photosensitive substrate by way of said first fly's eye lens, said first optical system, said prism member, said second fly's eye lens, said condenser optical system, said photomask and said projection optical system in this order, and said prism member is movable in a direction in which said prism member rotates with respect to an optical axis of said second fly's eye lens.

19. An exposure method for transferring a pattern formed on a photomask onto a photosensitive substrate, comprising:

a step of supplying a light beam;

a step of guiding said supplied beam to a multi-light-source forming optical system by way of a deflecting device;

a step of forming a plurality of light source images, based on a light beam from said deflecting device;

a step of condensing a light beam from said multi-light-source forming optical system and illuminating said photomask supported on a first stage in a superimposed manner; and a step of forming an image of said photomask on said photosensitive substrate supported on a second stage by using a projection optical system, wherein said deflecting device adjusts an angle of a light beam passing the inside of said multi-light-source forming optical system, keeping a shape of plural-light-source images formed by said multi-light-source forming optical system to be substantially constant so that density of the light beam on said illuminated surface changes, when a slant illuminance distribution substantially exists on said photomask.

20. An exposure method according to claim 19, further comprising a step of detecting information corresponding to the slant illuminance distribution on said photomask, wherein said step of detecting information is alternately performed with said step of forming the image of said photomask on said photosensitive substrate.

21. An exposure method according to claim 20, wherein the information corresponding to the slant illuminance distribution on said photomask is detected on said second stage.

22. An exposure method according to claim 19, wherein the angle of the light beam passing the inside of said multi-light-source forming optical system is changed by decentering said deflecting device with respect to said multi-light-source forming optical system.

23. The illumination optical apparatus according to claim 2, further comprising a projection optical system for projecting a pattern of an original set on said surface of the object which is illuminated by said condenser optical system on a photosensitive substrate.

24. A method of fabricating a semiconductor device by using the illumination optical system according to claim 23, said method comprising the steps of:

illuminating said original with light from said condenser optical system; and exposing said photosensitive substrate against the light from said pattern of the original by said projection optical system.

25. The illumination apparatus according to claim 23, further comprising:

a parallel plane plate arranged at a light source side of said auxiliary optical integrator, wherein said deflecting device rotates said parallel plane plate around an axis substantially perpendicular to an optical axis of said collecting optical system together with moving said auxiliary optical integrator in a direction substantially perpendicular to an optical axis of said light collecting optical system.

26. A method of fabricating a semiconductor device by using the illumination optical system according to claim 25, said method comprising the steps of:

illuminating said original with light from said condenser optical system; and exposing said photosensitive substrate against the light from said pattern of the original by said projection optical system.

27. The illumination apparatus according to claim 25, further comprising:

a detection device for detecting an illuminance distribution on an imaging plane of said original which is formed by said projection optical system; and a controller for controlling said deflecting device based on an output from said detection device.

28. A method of fabricating a semiconductor device by using the illumination optical system according to claim 27, said method comprising the steps of:

illuminating said original with light from said condenser optical system; and exposing said photosensitive substrate against the light from said pattern of the original by said projection optical system.

29. The illumination apparatus according to claim 23, wherein said deflecting device moves said auxiliary optical integrator in a direction substantially perpendicular to an optical of said collecting optical system.

30. A method of fabricating a semiconductor device by using the illumination optical system according to claim 23, said method comprising the steps of:

illuminating said original with light from said condenser optical system; and exposing said photosensitive substrate against the light from said pattern of the original by said projection optical system.

31. The illumination apparatus according to claim 29, further comprising:

a detection device for detecting an illuminance distribution on an imaging plane of said original which is formed by said projection optical system; and a controller for controlling said deflecting device based on an output from said detection device.

32. A method of fabricating a semiconductor device by using the illumination optical system according to claim 31, said method comprising the steps of:

illuminating said original with light from said condenser optical system; and exposing said photosensitive substrate against the light from said pattern of the original by said projection optical system.

33. The illumination optical apparatus according to claim 23, wherein said deflecting device moves at least one lens component belonging to said condenser optical system in a direction substantially perpendicular to an optical axis of said collecting optical system.

34. A method of fabricating a semiconductor device by using the illumination optical system according to claim 33, said method comprising the steps of:

illuminating said original with light from said condenser optical system; and exposing said photosensitive substrate against the light from said pattern of the original by said projection optical system.

35. The illumination apparatus according to claim 33, further comprising:

a detection device for detecting an illuminance distribution on an imaging plane of said original which is formed by said projection optical system; and a controller for controlling said deflecting device based on an output from said detection device.

36. A method of fabricating a semiconductor device by using the illumination optical system according to claim 35, said method comprising the steps of:

illuminating said original with light from said condenser optical system; and exposing said photosensitive substrate against the light from said pattern of the original by said projection optical system.

37. The illumination optical apparatus according to claim 23, wherein said deflecting device comprises a pair of angle-deviating prisms arranged as rotatable about a direction of an optical axis of said collecting optical system and wherein said pair of angle-deviating prisms deflect the light beam incident into said main optical integrator when said angle-deviating prisms rotate opposite to each other.

38. A method of fabricating a semiconductor device by using the illumination optical system according to claim 37, said method comprising the steps of:

illuminating said original with light from said condenser optical system; and exposing said photosensitive substrate against the light from said pattern of the original by said projection optical system.

39. The illumination apparatus according to claim 37, further comprising:

a detection device for detecting an illuminance distribution on an imaging plane of said original which is formed by said projection optical system; and a controller for controlling said deflecting device based on an output from said detection device.

40. A method of fabricating a semiconductor device by using the illumination optical system according to claim 39, said method comprising the steps of:

illuminating said original with light from said condenser optical system; and exposing said photosensitive substrate against the light from said pattern of the original by said projection optical system.

* * * * *